United States Patent [19]

Opiela et al.

[11] 4,169,970
[45] Oct. 2, 1979

[54] MEMORIAL AUDIO REPRODUCTION SYSTEM

[76] Inventors: Michael L. Opiela, 5934 Appoline, Dearborn, Mich. 48126; Stanley D. Zelazny, 7583 Driftwood Way, Pleasanton, Calif. 94566

[21] Appl. No.: 877,235

[22] Filed: Feb. 13, 1978

[51] Int. Cl.$^2$ ............................................. G11B 1/04
[52] U.S. Cl. ...................... 179/100.1 C; 40/124.5; 40/455; 109/23; 360/12
[58] Field of Search .................. 360/12; 179/100.1 C; 40/124.5, 455; 52/102, 103

[56] References Cited

U.S. PATENT DOCUMENTS

| | | | |
|---|---|---|---|
| 3,048,083 | 8/1962 | Rosenbaum | 179/100.1 C |
| 3,570,159 | 3/1971 | Burgener, Jr. et al. | 40/124.5 X |
| 3,636,272 | 1/1972 | Davis, Jr. et al. | 179/100.1 C |

FOREIGN PATENT DOCUMENTS 1009110  5/1952  France ..................................... 40/455

OTHER PUBLICATIONS

*The Wall Street Journal*, Thursday, Mar. 28, 1974.

*Primary Examiner*—Bernard Konick
*Assistant Examiner*—Donald McElheny, Jr.
*Attorney, Agent, or Firm*—Remy J. VanOphem

[57] ABSTRACT

An audio reproduction system is provided for use in conjunction with a tombstone for the repeated playback, upon activation, of a prerecorded message. The system comprises a housing which is secured within the tombstone. A prerecorded message on an endless magnetic tape is operatively mounted within a tape playback device which in turn is contained within the interior of the housing. A Hall effect switch wholly contained within the housing activates, upon closure, a time module to operatively connect a self-contained source of electrical power to the tape playback device for the predetermined period of time. A solar cell is also operatively coupled with the electrical power source to supplement the same.

12 Claims, 3 Drawing Figures

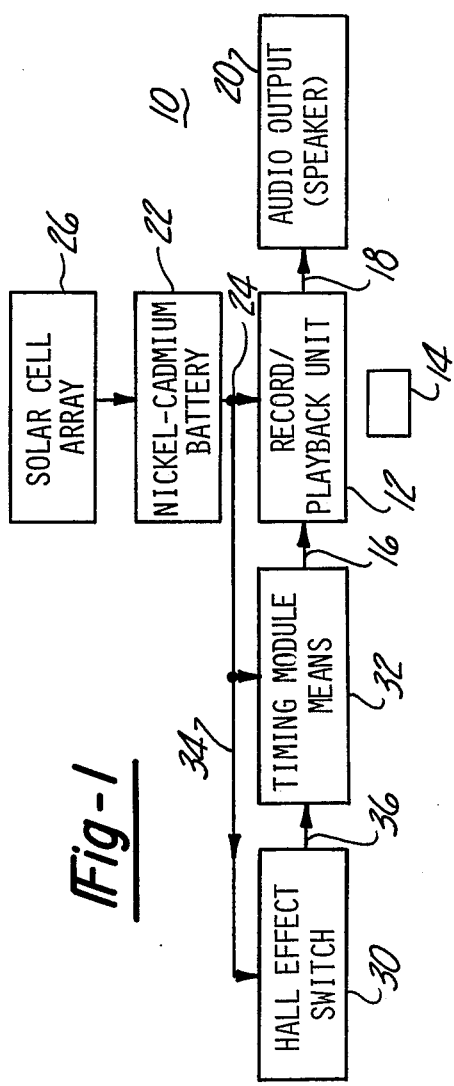
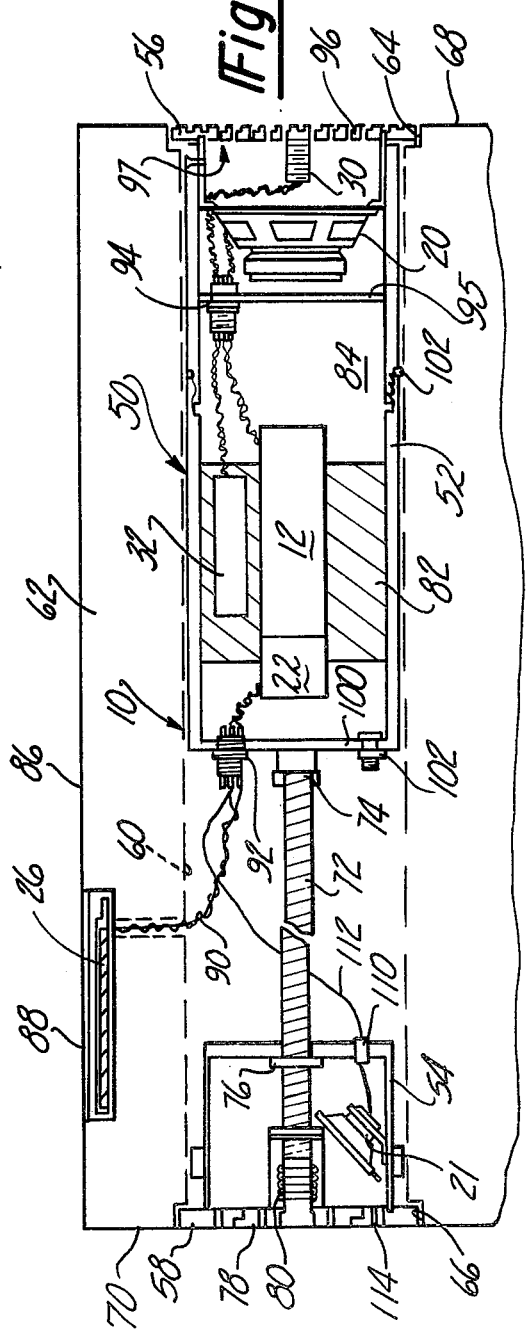

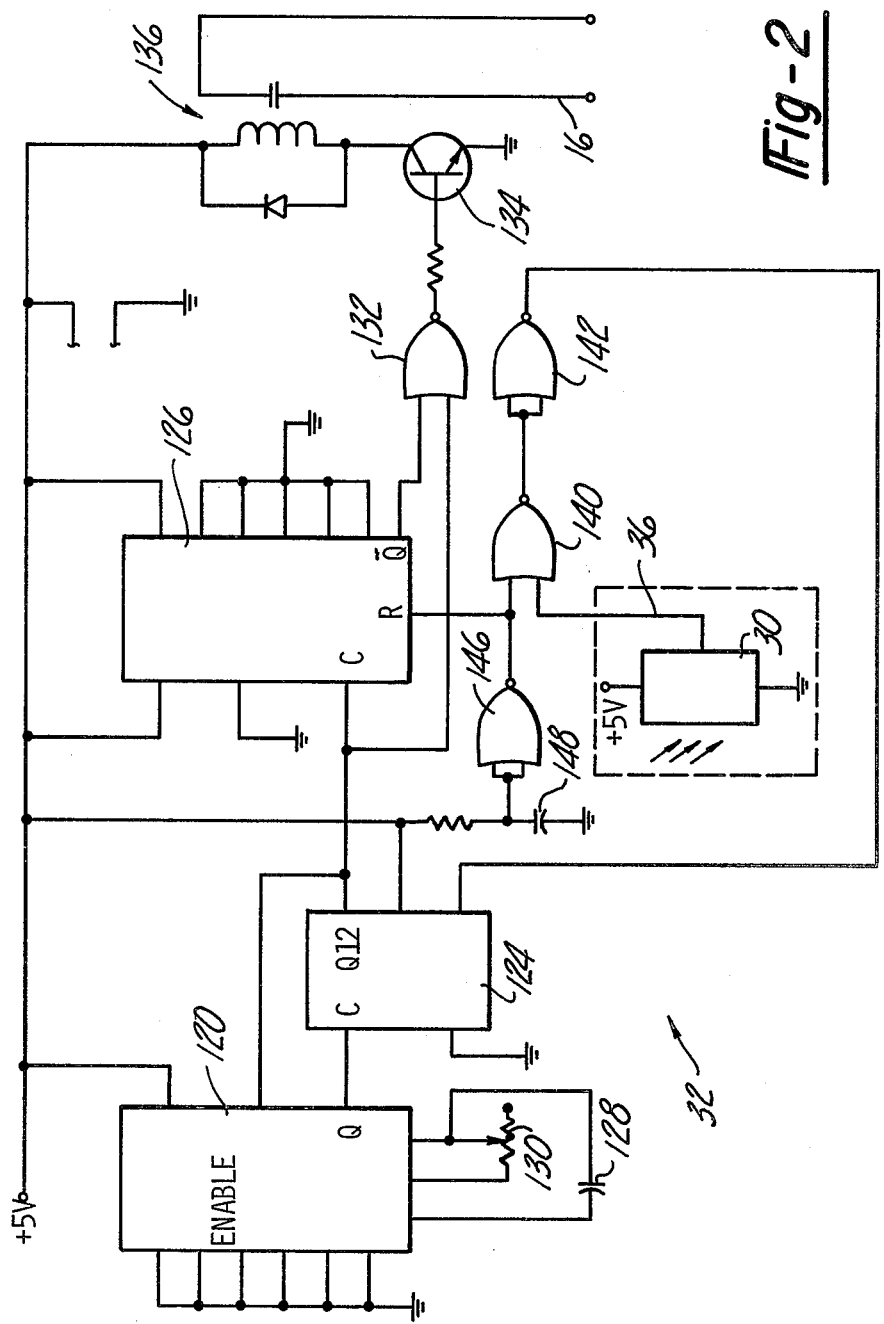

MEMORIAL AUDIO REPRODUCTION SYSTEM

BACKGROUND OF THE INVENTION

I. Field of the Invention

The present invention relates to audio reproduction systems for playing prerecorded messages and, more particularly, to such a system for use with tombstones, memorial monuments, and similar artifacts.

II. Description of the Prior Art

There are a number of previously known audio reproduction systems which, upon activation, audibly reproduce a prerecorded message. Several of these previously known reproduction systems generate a commercial message as a sales aid in stores and merchandising centers. While any of several recording media can be employed for the prerecorded message, a tape recorder with a prerecorded magnetic tape is perhaps the most commonly used. Moreover, it is conventional to employ an endless magnetic tape, i.e. a magnetic tape in which the two ends are connected together, so that the prerecorded message can be continuously repeated without rewinding the magnetic tape.

It would be advantageous to provide an audio reproduction system to play a prerecorded message for a tombstone, memorial monument, or similar artifact (hereinafter sometimes referred to as a memorial monument for brevity). Such a system would, for example, enable one to record his final farewell to his friends and family for playback at the time of his funeral service or even subsequently. Such a prerecorded message would serve not only as a great comfort to the friends and family of the deceased but also would enable the deceased to rest easy knowing that he had had the final say. For a plurality of diverse reasons, however, no previous audio reproduction system for memorial monuments have been heretofore known.

One previously known obstacle to providing an audio reproduction system for a memorial monument is that the previously known systems are bulky, unsightly and tend to detract from the dignity of the funeral service.

A still further obstacle in providing an audio reproduction system for memorial monuments is that the previously known reproduction systems are prohibitively expensive if the prerecorded message is played on only one occasion, e.g. during the funeral service of the deceased. Conversely, the expense of such reproduction systems can be more readily justified if the prerecorded message can be repeated at demand over a relatively long period of time, for example, at each anniversary of the death of the deceased. Repeated audio reproduction of the prerecorded message with these previously known reproduction systems, however, cannot be achieved for a number of reasons.

First, these previously known audio reproduction systems if positioned on a tombstone or memorial monument will be subjected to continual abuse not only by the environment, but also by vandals who unfortunately roam cemeteries. Consequently, the life expectancy of these previously known reproduction systems is rather limited, at best.

A still further obstacle encountered with these previously known reproduction systems are that such systems require electrical power in order to audibly reproduce the prerecorded message. While electrical outlets are found in virtually all stores and merchandising centers, electrical power is usually unavailable throughout cemeteries. These previously known audio reproduction systems, of course, can in many cases be powered by electrical batteries, but even this solution is inadequate. First, during each playback of the prerecorded message, a portion of the total electrical power contained by the battery is consumed and the battery eventually becomes depleted. Moreover, it can be expected that repeated activation of the audio reproduction system by vandals, mischief-makers, and the like will rapidly deplete such battery power. Consequently, these previously known audio reproduction systems, even if battery powered, would require continual, troublesome and expensive battery replacement. If the battery replacement is too simplified, it can be expected that vandals will not only steal the batteries but also damage the reproduction system in the process.

For all the above reasons, and others, no previously known audio reproductive systems for memorial monuments have been heretofore known.

SUMMARY OF THE PRESENT INVENTION

The present invention overcomes the above mentioned disadvantages by providing a memorial monument audio reproduction system for repeated replay of a recorded message.

In order to protect the audio reproduction system both from the elements and from the vandals, the system is contained within a two part housing, each housing part being cylindrical and having an enlarged diameter abutment flange formed adjacent one end. The housing parts, in turn, are mounted coaxially in a throughbore formed in the memorial monument so that the memorial monument itself, typically constructed of granite, protects the reproduction system. Additionally, since the reproduction system is contained within the interior of the monument, the system is desirably unobtrusive at the grave site and its presence well concealed from vandals.

Electrical power for the audio reproduction system is provided first by a high energy power source, such as a nickle-cadmium battery, and secondly by a solar cell mounted onto the memorial monument. The solar cell which generates electrical power in response to the impingement of radiant light, indefinitely generates the electrical power necessary to power the reproduction system.

The audio reproduction system itself comprises a magnetic tape playback device, e.g. a tape recorder, operatively associated with a magnetic tape containing a prerecorded message. The magnetic tape is an endless tape such that the prerecorded message can be repeatedly played without the necessity of rewinding the tape.

In order to activate the tape playback device, a Hall effect switch, wholly contained within the housing, is coupled to and activates a time module means upon a momentary closure of the switch. The time module means, in turn, when activated, generates an output signal to activate the tape playback means for a predetermined period of time sufficient to playback the prerecorded message. The Hall effect switch is actuated or closed by moving a magnet near the proximity of the switch and exteriorly of the housing.

BRIEF DESCRIPTION OF THE DRAWINGS

A better understanding of the present invention will be had upon reference to the following detailed description when read in conjunction with the accompanying drawing, wherein like reference characters refer to like parts throughout the several views, and in which:

FIG. 1 is a block diagrammatic view illustrating the audio reproduction system according to the present invention;

FIG. 2 is a schematic view of a portion of the audio reproduction system according to the present invention; and FIG. 3 is a side cross-sectional view illustrating the audio reproduction system of the present invention installed in a memorial monument.

DETAILED DESCRIPTION OF THE PRESENT INVENTION

With reference first to FIG. 1 a block diagrammatic view of the audio reproduction system 10 of the present invention is thereshown and comprises a record/playback unit 12 such as a tape recorder. The record/playback unit 12 is adapted to receive a tape cassette 14 therein with a prerecorded message. The tape in the cassette 14 is preferably endless, i.e. the ends are joined together, so that rewinding of the tape cassette 14 is never required. An electrical signal from a line 16 activates the unit 12 which produces an electrical signal on an output line 18 representative of the prerecorded message on the cassette 14. The line 18 in turn is coupled to a speaker 20 to audibly reproduce the prerecorded message.

Still referring to FIG. 1, a battery 22 supplies electrical power via line 24 to power the record/playback unit 12. The battery 22 is preferably a nickel-cadmium battery due to its high electrical power storage capabilities and its resultant long life.

As a secondary power source, a solar cell array 26 is coupled in parallel to the battery 22 and generates sufficient electrical power in response to the impingement of radiant energy to power the recorder/playback unit 12 in the event of failure of the battery 22. In addition, preferably, a battery recharge circuit (not shown) can be coupled to the output from the solar cell array 26 so that the solar cell array 26 continuously recharges the battery 22 during daylight periods.

With reference now to both FIGS. 1 and 3, a Hall effect switch 30 and time module means 32 together provide the activation signal on line 16 to the record/playback unit 12. More specifically, the Hall effect switch 30 is connected by a line 34 to the electrical energy source 22 and, when a magnet is moved into the proximity of the Hall effect switch 30, the switch 30 closes and connects the power line 34 via line 36 to an input of the time module means 32. It will be understood, however, that other types of switches, for example a key operated mechanical switch, can alternatively be used to activate the time module means 32 while remaining within the scope and intent of the present invention. In addition, an illumination means, for example an LED, can be connected with the switch 30 to provide a visual indication of the switch actuation.

With reference to FIG. 2, the time module means 32 includes an astable multivibrator 120 having a clock (Q) output connected to the clock input of a twelve stage counter 124. The Q12 output from the counter 124 is connected to both the clock input of a D flip flop 126 and to the ENABLE input of the multivibrator 120. Activation of the multivibrator in a manner to be shortly described, thus produces a pulse of a predetermined time period on the Q12 output of the counter 124. This pulse, however, can be varied by a capacitor 128 and variable resistor 130 connected to the multivibrator 120.

Both the Q12 output from counter 124 and the Q output from the flip flop 126 are connected to the inputs of a NOR gate 132 having its output connected to the base of a NPN transistor 134. Activation or switching of the transistor 134 from the output of the gate 132 in turn closes a relay 136 and activates the record/playback unit 12 along line 16.

Activation of the multivibrator 120 is accomplished by the Hall effect switch 30 having its output connected via a NOR gate 140 and inverter 142 to the RESET input of the counter 124. Closure and opening of the switch 30 drives the Q12 output of the counter 124 low which both enables the multivibrator 120 and turns on the transistor 134 via the flip flop 126 and NOR gate 132. At $2^{12}$ clock pulses from the multivibrator, the Q12 output from the counter 124 goes high which simultaneously disables the multivibrator 120 and the NOR gate 132 until the counter 124 is reset by a subsequent closure and opening of the switch 30.

Unintended activation of the record/playback unit 20 upon connection of the power to the time module means 32 is prevented by an inverter 146 having its input connected to the power line and to ground via a blocking capacitor 148. The output from the inverter 146 is connected to the reset input of the flip flop 126 to disable the gate 132 and thus prevent switching of the transistor 134.

With reference now to FIG. 3, the physical construction of the audio reproduction system 10 according to the present invention is thereshown and comprises a housing 50 having a first housing part 52 and a second housing part 54. Each housing part 52 and 54 is preferably cylindrical in shape and includes an enlarged diameter portion 56 and 58 respectively, at one end. The housing parts 52 and 54 are coaxially mounted within a throughbore 60 formed in a memorial monument 62. The throughbore 60 includes an enlarged diameter portion 64 and 66 corresponding to the enlarged diameter portions 56 and 58 on the housing parts so that the ends of the housing parts 52 and 54 are substantially flush with the sides 68 and 70 of the memorial monument 62.

A threaded shaft 72 is coaxially coupled at 74 to the inner end 100 of the housing part 52 and threadably engages a nut 76 in the second housing part 54. Access to the nut 76 is achieved by a removable axial end piece 78 on the outer axial end of the second housing part 54. When the nut 76 is properly adjusted to lock the housing parts 52 and 54 within the throughbore 60, so that the enlarged diameter portions 56 and 58 abut against the memorial monument 62, the end piece 78 is repositioned on the second housing part 54 and locked in place by means of a tumbler lock 80.

The record/playback unit 12 is mounted in a foam rubber holder 82 which, in turn, is mounted within the interior 84 of the first housing part 52. Similarly, the time module means 32 and the batteries 22 are mounted in the foam rubber holder 82 for mechanical shock insulation. The solar cell array 26 is mounted on the top 86 of the memorial monument 62 under a clear acrylic housing 88 and is electrically connected via line 90 and an electrical connector 92 to the battery 22.

A further electrical connector 94 through a housing diametric wall 95 couples the record/playback unit 12 to the speaker 20 and also connects the Hall effect switch 30 to the time module means 32. The exteriorly exposed axial end of the first housing part 52 has a plurality of horizontally extending slots 96 formed therethrough and forms a grill 97 for the speaker 20 while the Hall effect switch 30 is mounted wholly within the housing part 52 on the speaker grill 97. If stereo audio production is desired, a further speaker 21 can be provided within the interior of the second housing part 54 and connected via an electrical connector 110 and line 112 to the record/playback unit 12. In this case, the enlarged diameter portion 58 and/or the end piece 78 is provided with slots 114 and forms a speaker grill. In addition, a headphone jack (not shown) can be included in the enlarged diameter portion 56 or 58 for private listening of the prerecorded message.

The interior 84 of the housing part 52 between the wall 95 and the inner axial end 100 of the housing part 52 is fluidly sealed by an O-ring 102 or similar means. In addition, a gas nipple 102 on the housing part 52 enables not only the interior 84 of the housing part 52 to be vacated but also to be filled with a corrosion resistant gas, such as nitrogen. The gas prevents corrosion, oxidation, and the like of the electronic and mechanical components contained within the housing part 52 and thus insures long life for the audio reproduction system 10 of the present invention.

Although the operation of the audio reproduction system 10 according to the present invention should be by now apparent, it will be briefly summarized in the interest of clarity. In brief, with the audio reproduction system 10 installed within the memorial monument 62 in the fashion depicted in FIG. 3, placement of a magnet exteriorly of the housing 50 but adjacent the Hall effect switch 30 activates the time module means 32 which provides an activation signal along line 16 to the record/playback unit 12 for a predetermined time period. This predetermined time period is sufficient to enable the prerecorded message on the tape cassette 14 to be played through the speaker 20 and to be heard by those near the memorial monument 62. Upon completion of the audio playback of the prerecorded message, the time module means 32 deactivates and turns off the record/playback unit 12 to thereby conserve electrical power.

It can, therefore, be seen that the audio reproduction system according to the present invention achieves many advantages over the previously known audio reproduction systems. In particular, the solar cell array 26 in combination with the longlife battery source 22 insures continuous electrical power supply to the playback unit 12 so tht the prerecorded message can be periodically played over a theoretically indefinite period of time without the need for an external power supply, battery replacement, or other maintenance.

The audio reproduction system 10 according to the present invention is further advantageous in that the system itself is concealed within the memorial monument 62. This, as aforesaid, protects the audio reproduction system not only from elements but also from vandals. Moreover, by concealing the system 10 within the memorial monument 62, the system 10 does not distract from the sincerity of funeral services in an objectionable way.

Furthermore, the enclosure of the Hall effect switch 30 within the interior of the housing 50 and the required activation of the switch 30 by moving a magnet along the speaker grill 97 effectively prevents the unwanted and undignified playback of the prerecorded message by vandals and other unauthorized persons. Such unauthorized persons rarely carry magnets.

Having described my invention, many modifications thereto will become apparent to those skilled in the art to which it pertains without deviation from the spirit of the invention as defined by the scope of the appended claims.

I claim:

1. An audio announcement system for a memorial monument comprising:
   a housing,
   means for mounting the housing within a memorial monument,
   an audio recording medium having a prerecorded audio message contained thereon,
   audio playback means contained within the housing for accepting said recording medium and, upon activation, playing said prerecorded message,
   means for activating said playback means for a predetermined time period, and
   wherein said housing further comprises a first tubular part and a second tubular part in axial alignment, said housing parts adapted to be substantially wholly positioned in a throughbore in the memorial monument and wherein said mounting means comprises an enlarged diameter portion at one end of each housing part which abuts against the memorial monument, and means for locking the other ends of the housing parts coaxially together.

2. The invention as defined in claim 1 and including electrical power means electrically connected to said playback means, said power means further comprising a battery contained within said housing and solar energy power means having a portion exteriorly visible of the memorial monument and electrically connected to said playback means.

3. The invention as defined in claim 2 wherein said solar energy power means is electrically connected to and is adapted to recharge said battery.

4. The invention as defined in claim 1 wherein said last mentioned means comprises a rod having one end secured to one housing part and means for securing the other end of the rod to the other housing part.

5. The invention as defined in claim 4, wherein said rod is threaded and wherein said securing means comprises a nut which threadably engages the rod.

6. The invention as defined in claim 1 wherein said playback means is contained within the first housing part and wherein said first housing part is filled with a corrosion resistant gas.

7. The invention as defined in claim 5 wherein said audio playback means further comprises two speakers, one speaker being contained in each housing part.

8. The invention as defined in claim 1 wherein said activation means further comprises a time module means for producing an output signal for said predetermined period of time upon activation, said time module means output being coupled to said playback means to activate said playback means, and a switch which, upon activation, activates said time module means.

9. The invention as defined in claim 8 wherein said switch is a Hall effect switch.

10. The invention as defined in claim 8 and including means for varying said predetermined time period.

11. The invention as defined in claim 8 wherein said playback means is a tape recorder and said recording medium is an endless tape.

12. The invention as defined in claim 8 wherein said time module means includes means for preventing unintended activation of said time module means upon connection of electrical power to said time module means.

* * * * *